United States Patent [19]
Gibson

[11] Patent Number: 5,425,495
[45] Date of Patent: Jun. 20, 1995

[54] HOT AIR CIRCULATION METHOD FOR WAVE SOLDERING MACHINES

[75] Inventor: David E. Gibson, Roswell, Ga.

[73] Assignee: AT&T Global Information Solutions Corporation, Dayton, Ohio

[21] Appl. No.: 239,004

[22] Filed: May 6, 1994

Related U.S. Application Data

[62] Division of Ser. No. 137,550, Oct. 19, 1993, Pat. No. 5,379,943.

[51] Int. Cl.⁶ .......................... H05K 3/34; B23K 1/20
[52] U.S. Cl. .................................... 228/223; 228/232; 427/348; 427/378
[58] Field of Search ................. 228/179.1, 180.1, 205, 228/207, 223, 232; 427/348, 378

[56] References Cited

U.S. PATENT DOCUMENTS

| | | | |
|---|---|---|---|
| 3,724,418 | 4/1973 | McLain | 228/37 |
| 3,921,888 | 1/1993 | Elliott | 228/180.1 |
| 4,637,541 | 1/1987 | Tanny | 228/36 |
| 4,657,172 | 4/1987 | Lee | 228/254 |
| 4,720,034 | 1/1988 | Lee | 228/37 |
| 4,846,390 | 7/1989 | Masuda et al. | 228/49.5 |
| 5,110,036 | 5/1992 | Parker, Jr. | 228/256 |
| 5,230,460 | 7/1993 | Deamborsio et al. | 228/180.1 |
| 5,232,562 | 8/1993 | Elliott | 204/140 |
| 5,240,018 | 8/1993 | Clark et al. | 228/201 |
| 5,281,281 | 1/1994 | Stafanowski | 228/223 |

FOREIGN PATENT DOCUMENTS 2917581 11/1980 Germany .
3427004 1/1986 Germany .
912424 3/1982 U.S.S.R. .

OTHER PUBLICATIONS

*List* of 76 patents from patent search.
Kester Solder; Kester 970 VOC-Free, No-Clean Soldering Flux; Date Unknown; p. 1.
IBM Technical Disclosure Bulletin, "Solder Wave Air Knife", vol. 28, No. 2, pp. 680, 681, Jul. 1985.

*Primary Examiner*—Samuel M. Heinrich
*Attorney, Agent, or Firm*—Paul W. Martin

[57] ABSTRACT

A hot air circulation apparatus and method for wave soldering machines which heats air from a high-pressure air source and directs it at the flux applied to a printed circuit board. The heated and pressurized air also circulates air within the wave soldering machine to force the moisture out. A plurality of hot air knives are mounted adjacent heaters within the wave soldering machine and are coupled to the pressurized air source. The hot air knives include a hollow metal cylindrical member which conducts heat from the heater, and contain a plurality of orifices which increase the pressure of the air and direct the air at the flux.

4 Claims, 2 Drawing Sheets

HOT AIR CIRCULATION METHOD FOR WAVE SOLDERING MACHINES

This is a Division of application Ser. No. 08/137,550, filed Oct. 19, 1993, now U.S. Pat. No. 5,379,943.

BACKGROUND OF THE INVENTION

The present invention relates to soldering and soldering machines, and more specifically to a hot air circulation apparatus and method for wave soldering machines.

Wave soldering machines are typically used to solder components onto printed circuit boards. Such machines employ a fluxer for applying flux to the solderable surfaces of the printed circuit boards, preheaters to preheat the printed circuit boards, and a solder wave to apply liquid solder to the solderable surfaces. One such machine is manufactured by Electrovert, Inc.

The preferred flux used in wave soldering machines is a resin flux. resin fluxes provide smooth finished surfaces. However, resin fluxes contain environmentally harmful and flammable volatile organic compounds.

An alternative to resin fluxes is a water-based flux, such as the 970 and 970CTX flux products from Kester Corporation. An air knife is typically located after the flux tank to remove excess flux from printed circuit boards and prevent dripping on preheater surfaces. A warm gentle airflow is required so as not to blow the flux off the board.

The water-based flux is environmentally safe, but when used in wave soldering machines suffers from the disadvantage that the water cools the printed circuit board and causes solder balls to form. Previous attempts at making the water-based flux usable in wave soldering machines have been unsuccessful.

Therefore, it would be desirable to provide an apparatus and method that would allow wave soldering machines to use the water-based fluxes.

SUMMARY OF THE INVENTION

In accordance with the teachings of the present invention, a hot air circulation apparatus and method for wave soldering machines is provided. The hot air circulation apparatus heats air from a high-pressure air source and directs it at the flux applied to a printed circuit board. The heated and pressurized air also circulates air within the wave soldering machine to force the moisture out. A plurality of hot air knives are mounted adjacent heaters within the wave soldering machine and are coupled to the pressurized air source. The hot air knives include a hollow cylindrical metal device which conducts heat from the heater, and which contains a plurality of orifices which increase the pressure of the air and direct the air at the flux.

It is accordingly an object of the present invention to provide a hot air circulation apparatus and method for wave soldering machines.

It is another object of the present invention to provide a hot air circulation apparatus and method for wave soldering machines which forces heated and pressurized air against the water-based flux and into the cheer to dry the flux and remove the moisture.

It is another object of the present invention to provide a hot air circulation apparatus and method for wave soldering machines which is easy to retrofit into existing wave soldering machines.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

DETAILED DESCRIPTION OF THE PREFERRED EMBODIMENT

Figure 1:
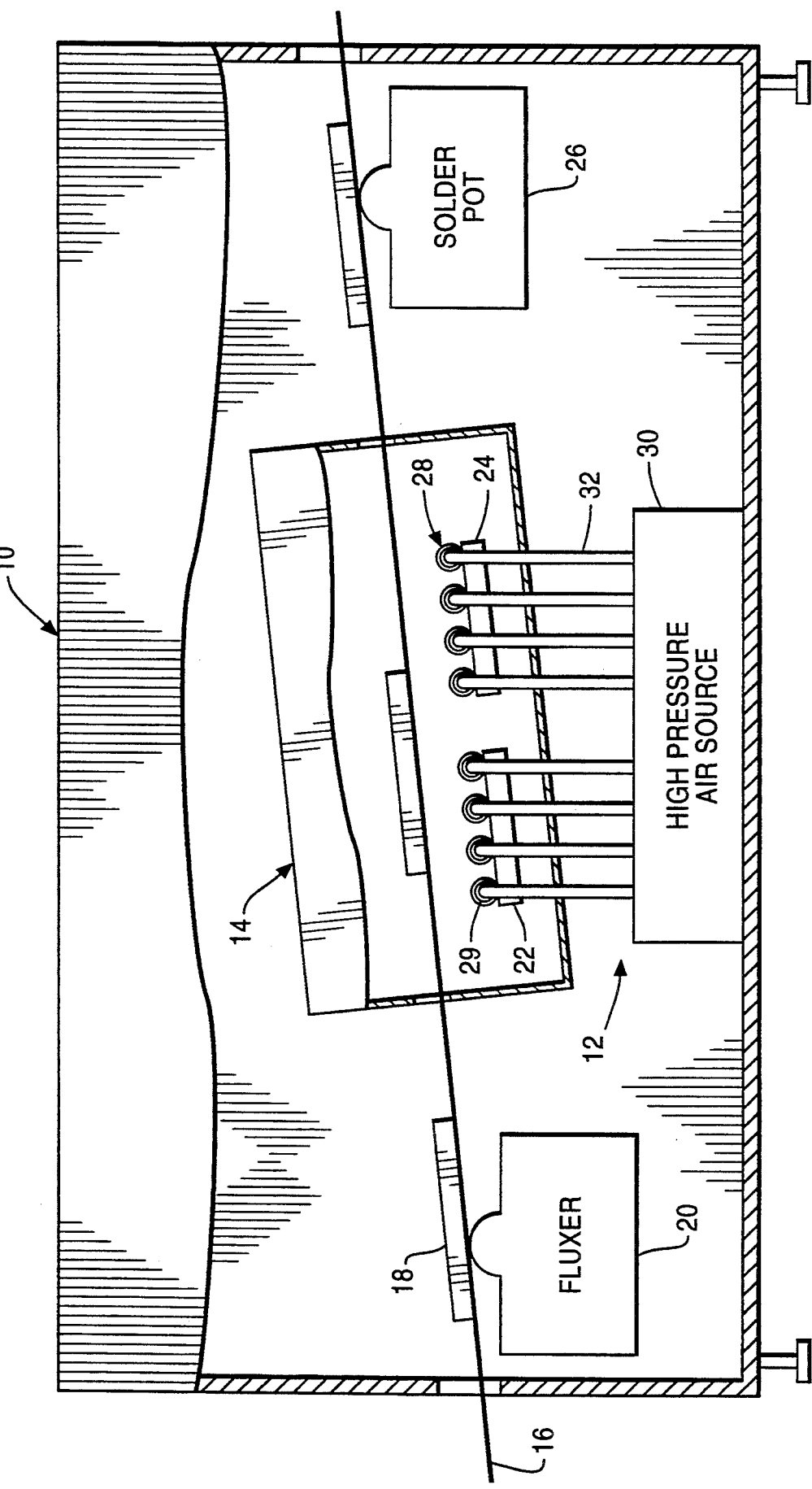
FIG. 1 is a diagrammatic view of a wave soldering machine employing the apparatus of the present invention.

Referring now to FIG. 1, a wave soldering machine 10 employing the hot air circulation apparatus 12 of the present invention is shown. Wave soldering machine 10 also includes tunnel chamber 14, conveyor 16, fluxer 20, heaters 22 and 24, and solder pot 26.

Conveyor 16 carries printed circuit boards 18 through tunnel chamber 14. Printed circuit boards 18 have components mounted thereon whose electrical contacts have previously been coated with solder bumps. Preferably, the flux applied by fluxer 20 is number 970 or 970CTX from Kester Corporation. Number 970CTX includes a special wetting agent to allow the flux to evenly spread. Heaters 22 and 24 preheat printed circuit boards 18 as they pass overhead. Solder pot 26 applies liquid solder and removes any excess flux from printed circuit board 18 and its components.

Hot air circulation apparatus 12 includes hot air knives 28, connectors 29, hoses 32, and high-pressure air source 30.

Hot air knives 28 apply high pressure, high-temperature air to dry the flux and to drive the moisture from the flux out of tunnel cheer 14. Hot air knives 28 are preferably mounted on heaters 22 and 24, thereby making installing and retrofitting hot air circulation apparatus easy. However, other mounting configurations for hot air knives 28 are envisioned by the present invention, which may include additional heaters. Preferably, hot air knives 28 are made of aluminum so as to rapidly conduct heat from heaters 22 and 24 to the high-pressure air rushing through knives 28. The first group of hot air knives 28 on heaters 22 tends to dry the flux, while the second group of knives on heater 24 tends to circulate and dry the air in tunnel chamber 14. Four hot air knives 28 on each of heaters 22 and 24 are preferred.

Hot air knives couple to high-pressure air source 30 through hoses 32 and connectors 29. Ordinary high-pressure air connectors and hoses may be employed. Preferably, high-pressure air source provides about 90 psi, which ensures adequate drying and circulation.

Figure 2:
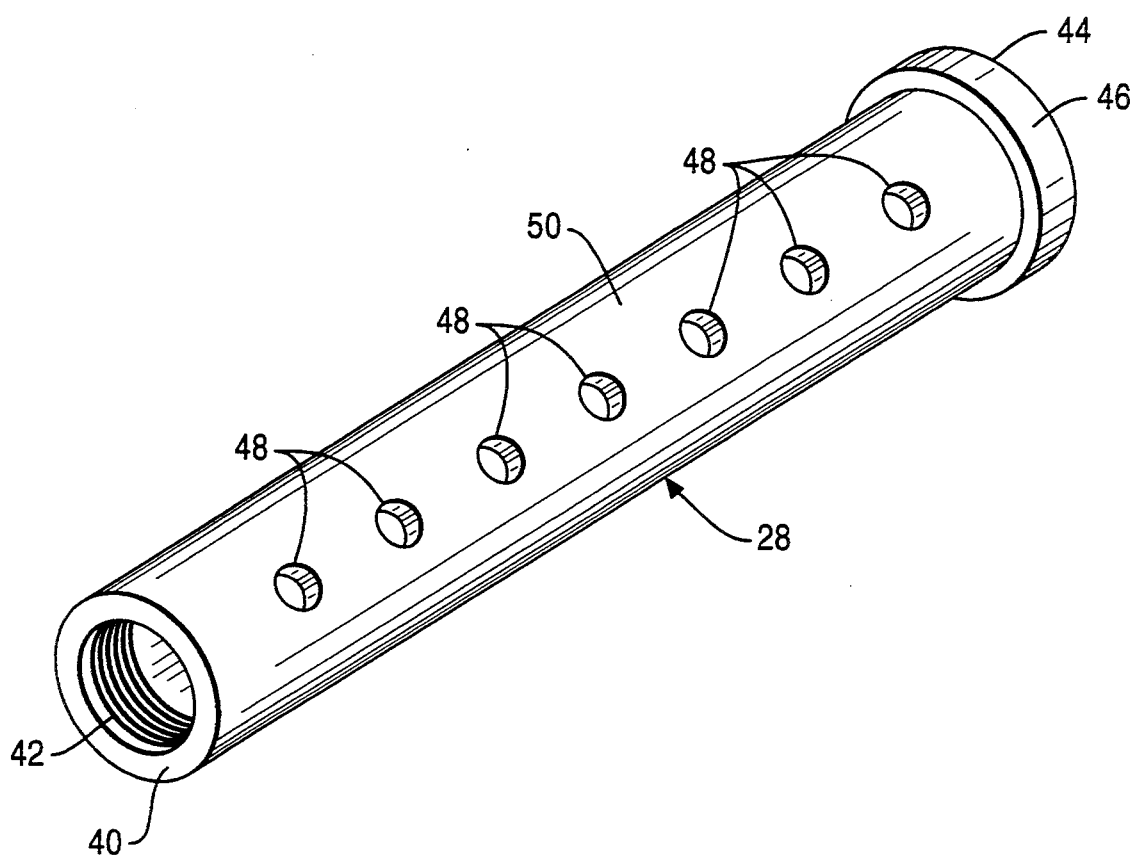
FIG. 2 is a perspective view of an air knife.

Turning now to FIG. 2, hot air knife 28 is shown in more detail. Air knife 28 is simply constructed, starting with a metal pipe, preferably aluminum. For the machine manufactured by Electrovert, Inc., a 0.400 inch outside diameter pipe with a thickness of about 0.070 inches and a length of about 24 inches is preferred. A standard end cap 46 is screwed onto end 44. At the other end 40, knife 28 has inside threads 42 for receiving connector 29.

With both ends 40 and 44 sealed, air from hot air source 30 passes through orifices 48, which are evenly spaced and oriented in a line along surface 50 of knife 28, perpendicular to the direction of travel of printed circuit board 18. Preferably, orifices 48 are about 0.300 inches on center apart, with the first orifice being about 1.5 inches from end 40. Orifices 48 are preferably 0.05 inches in diameter for about 90 psi. For this orifice diameter and input pressure, adequate circulation pressure and air flow volume are provided to drive moisture from tunnel chamber 14.

Although the present invention has been described with particular reference to certain preferred embodiments thereof, variations and modifications of the present invention can be effected within the spirit and scope of the following claims.

What is claimed is:

1. A method for removing moisture from a water-based flux on a printed circuit board moving through a wave soldering machine comprising the steps of:
   providing a pressurized air source for producing pressurized air;
   heating the pressurized air, including the substeps of providing an air knife including a hollow cylindrical member sealed at one end and coupled to the pressurized air source at another end and having a plurality of orifices which increase the pressure of the pressurized air, and providing a heater which heats the air knife and the pressurized air; and
   directing the heated and pressurized air at the water-based flux.

2. The method as recited in claim 1, wherein the step of directing comprises the substeps of:
   locating the air knife underneath the printed circuit board such that the orifices face the printed circuit board; and
   orienting the air knife in a direction substantially perpendicular to the direction of motion of the printed circuit board.

3. A method for removing moisture from a water-based flux on a circuit component comprising the step of:
   providing a pressurized air source for producing pressurized air;
   heating the pressurized air, including the substeps of providing a metal member coupled to the pressurized air source having an orifice through which the pressurized air flows, and providing a heater which heats the metal member and the pressurized air; and
   directing the heated and pressurized air at the water-based flux.

4. The method as recited in claim 3, wherein the step of directing comprises the substep of:
   locating the metal member underneath the circuit component such that the orifice faces the circuit component.

* * * * *

UNITED STATES PATENT AND TRADEMARK OFFICE
CERTIFICATE OF CORRECTION

PATENT NO. : 5,425,495
DATED : June 20, 1995
INVENTOR(S) : David Gibson

It is certified that error appears in the above-indentified patent and that said Letters Patent is hereby corrected as shown below:

Column 4, line 10, delete "step" and substitute --steps--.

Signed and Sealed this

Nineteenth Day of December, 1995

Attest:

BRUCE LEHMAN

*Attesting Officer*   *Commissioner of Patents and Trademarks*